United States Patent
Ciraula

(10) Patent No.: US 10,452,505 B2
(45) Date of Patent: Oct. 22, 2019

(54) ERROR INJECTION FOR ASSESSMENT OF ERROR DETECTION AND CORRECTION TECHNIQUES USING ERROR INJECTION LOGIC AND NON-VOLATILE MEMORY

(71) Applicant: ADVANCED MICRO DEVICES, INC., Santa Clara, CA (US)

(72) Inventor: Michael K. Ciraula, Fort Collins, CO (US)

(73) Assignee: Advanced Micro Devices, Inc., Santa Clara, CA (US)

(*) Notice: Subject to any disclaimer, the term of this patent is extended or adjusted under 35 U.S.C. 154(b) by 30 days.

(21) Appl. No.: 15/849,071

(22) Filed: Dec. 20, 2017

(65) Prior Publication Data

US 2019/0188064 A1    Jun. 20, 2019

(51) Int. Cl.
| | | |
|---|---|---|
| G06F 11/22 | (2006.01) |
| H03M 13/01 | (2006.01) |
| G06F 11/10 | (2006.01) |
| G06F 11/34 | (2006.01) |
| G11C 29/12 | (2006.01) |
| G06F 11/07 | (2006.01) |
| G11C 29/10 | (2006.01) |
| G06F 9/30 | (2018.01) |

(52) U.S. Cl.
CPC ...... *G06F 11/2215* (2013.01); *G06F 9/30029* (2013.01); *G06F 11/073* (2013.01); *G06F 11/0745* (2013.01); *G06F 11/0793* (2013.01); *G06F 11/1068* (2013.01); *G06F 11/3409* (2013.01); *G11C 29/10* (2013.01); *H03M 13/015* (2013.01); *G11C 2029/1202* (2013.01)

(58) Field of Classification Search
CPC ............. G06F 11/2215; G06F 11/1068; G06F 11/3409; H03M 13/015; G11C 2029/1202
See application file for complete search history.

(56) References Cited

U.S. PATENT DOCUMENTS

| | | | | |
|---|---|---|---|---|
| 5,142,541 A * | 8/1992 | Kim | ..................... | G06F 11/1008 714/764 |
| 6,064,721 A * | 5/2000 | Mohammadian | ....... | H04M 1/24 379/10.01 |
| 6,539,503 B1 * | 3/2003 | Walker | ............... | G01R 31/3183 714/32 |
| 6,751,756 B1 * | 6/2004 | Hartnett | .............. | G06F 9/30145 711/E12.017 |
| 8,392,766 B2 * | 3/2013 | Chyan | ................. | G06F 11/1068 714/702 |
| 8,650,447 B1 * | 2/2014 | Wortman | .......... | G01R 31/31851 365/201 |
| 2002/0157044 A1 * | 10/2002 | Byrd | ....................... | H04L 1/004 714/703 |

(Continued)

*Primary Examiner* — Joseph D Torres

(57) ABSTRACT

A memory system includes a non-volatile memory unit, a content-addressable memory unit coupled to the non-volatile memory unit, and an error injection logic unit coupled to the non-volatile memory unit and the content addressable memory unit. The non-volatile memory unit is programmed to allow a first error injection onto a first data word using the error injection logic unit. The error injection logic in combination with the content addressable memory unit replaces a bit cell in the memory system. The memory system performs an evaluation of various error detection and correction techniques.

20 Claims, 4 Drawing Sheets

(56) References Cited

U.S. PATENT DOCUMENTS

| | | | |
|---|---|---|---|
| 2007/0011599 A1* | 1/2007 | Levitan | G06F 11/2215 714/801 |
| 2007/0174679 A1* | 7/2007 | Chelstrom | G06F 11/2236 714/6.13 |
| 2007/0208977 A1* | 9/2007 | Clark | G01R 31/31856 714/728 |
| 2009/0249148 A1* | 10/2009 | Ito | G06F 11/1008 714/746 |
| 2012/0084628 A1* | 4/2012 | Cox | G06F 11/1048 714/763 |
| 2013/0151930 A1* | 6/2013 | Yigzaw | G06F 11/2236 714/768 |
| 2014/0143618 A1* | 5/2014 | Griffin | G11C 16/349 714/718 |
| 2014/0250340 A1* | 9/2014 | Cordero | G06F 11/28 714/703 |
| 2015/0162099 A1* | 6/2015 | Jeong | G11C 29/42 714/719 |
| 2018/0174665 A1* | 6/2018 | Kraipak | G11C 29/38 |

* cited by examiner

ERROR INJECTION FOR ASSESSMENT OF ERROR DETECTION AND CORRECTION TECHNIQUES USING ERROR INJECTION LOGIC AND NON-VOLATILE MEMORY

BACKGROUND

A processor, such as, for example, a central processing unit (CPU) or a graphic processing unit (GPU), typically utilizes error detection and correction techniques to ensure data reliability and thereby ensure proper operation. However, the error detection and correction techniques may have a detrimental impact on processor performance. For example, correcting errors "in-line" has a negative effect on benchmark performance because memory latency is increased for all memory accesses, not just memory accesses with errors. Thus, providing improved and cost-efficient techniques for the assessment of various error detection and correction techniques is desirable.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-4 illustrate example systems, modules, and methods of error injection caching architectures according to various embodiments, wherein the architectures employ logic configured for repairing a manufacturing defect is also used to inject correctable errors at specific memory locations. In particular, the cache architecture includes a memory structure, functionally equivalent to a content addressable memory (CAM), having at least some entries that are configured to replace defective memory locations in the cache. Thus, the CAM entries are located in the memory access path for the cache. By storing specified error data at the CAM, known errors are injected into the memory access path. The CAM therefore supports improved benchmarking and other testing of the memory access path, thereby improving processor reliability. Errors in typical cache memory systems are generally corrected using in-line data correction or retry data correction techniques. In-line data correction is data correction that occurs while data is being read or transferred from memory and negatively affects performance because, for example, memory latency is increased for all memory accesses (not just those that contain errors). Error correction using retry data correction typically incurs significant penalties on memory accesses that have an error. Due to the uncertainty of the performance impact of correcting errors using both in-line data correction and retry data correction, error detection and correction events are generally logged and reported using Machine Check Architecture, which is a standard technique used to report error correction errors and may be used in various embodiments. The prescribed systems, architectures, and methods described herein evaluate and measure the performance of error detection and correction schemes and allow for improved implementation of the various error detection and correction techniques that utilize, for example, Machine Check Architecture.

Figure 1:
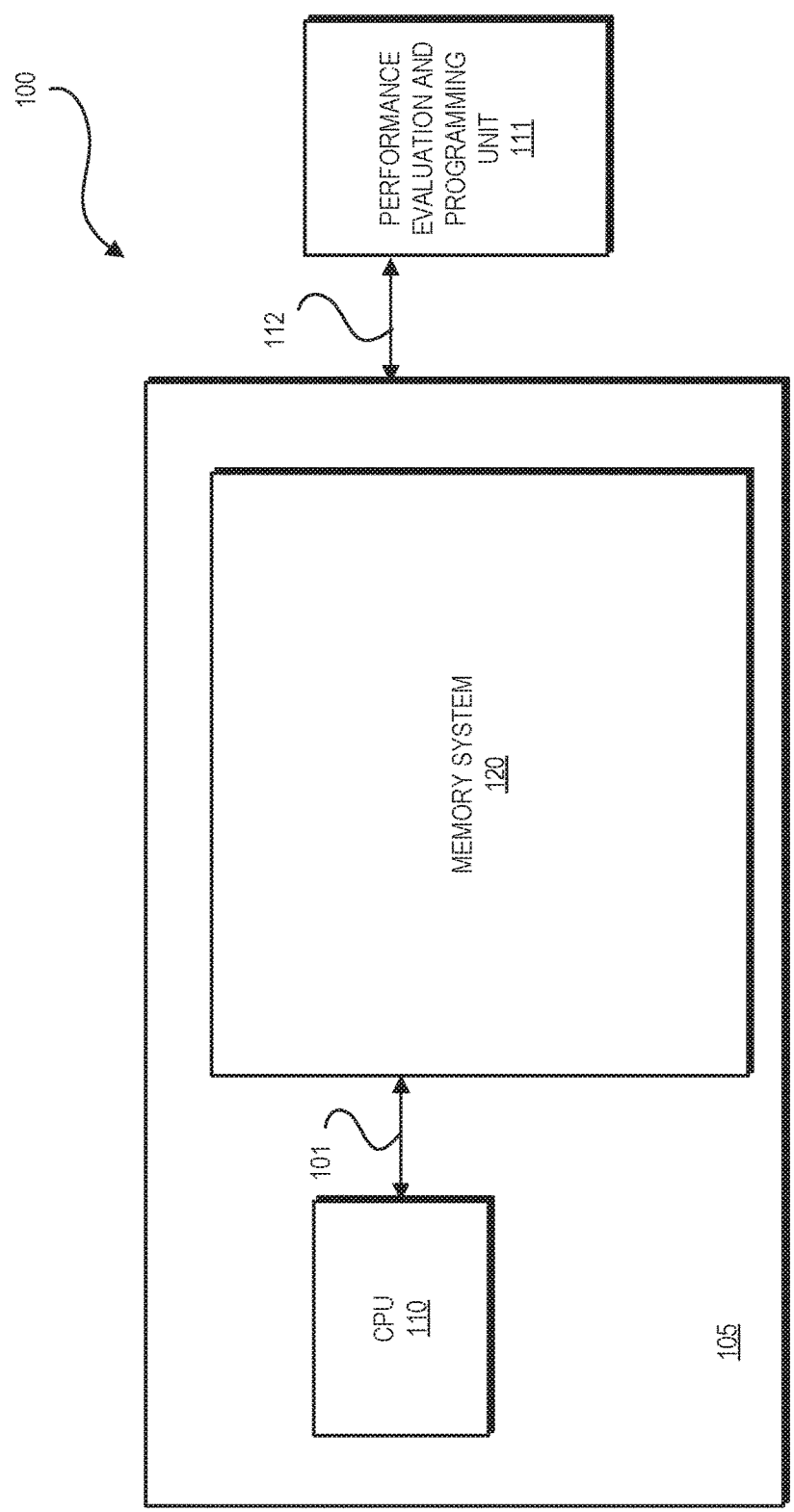
FIG. 1 is a block diagram illustrating an error detection and correction evaluation system according to various embodiments.

FIG. 1 is a block diagram illustrating an error detection and correction evaluation system 100 according to various embodiments. In various embodiments, error detection and correction evaluation system 100 evaluates the performance of error detection and correction techniques used by memory systems for various computer based systems. Error detection and correction techniques performed by (referring momentarily to FIG. 2) error detection and correction unit 261, such as, for example, single-error-correct, double-error-detect (SECDED) and double-error-correct, triple-error-detect (DECTED) are evaluated for performance effect using error detection and correction evaluation system 100. SECDED is an error detection and correction technique that, for a particular data word, is able to detect up to two data bit errors and correct a single bit error. DECTED is an error and correction technique that is able to detect three errors and correct two data bits. DECTED is an error and correction technique that differs from SECDED in that it provides additional correction and detection capabilities, but has an increased latency based on the increase in cycles required to perform error detection and correction. That is, DECTED typically takes more than two cycles for error detection and correction, while SECDED is able to perform error detection and correction in one cycle. In various embodiments, improvements of error detection and correction evaluation system 100 over other error detection and correction evaluation designs are based on the ability of memory system 120 to evaluate the performance of, for example, SECDED and/or DECTED, while other applications are running with only minimal logic added to the overall evaluation system.

In various embodiments, error detection and correction evaluation system 100 includes a processing system 105 and a performance evaluation and programming unit 111. Processing system 105 includes a central processing unit (CPU) 110 and a memory system 120. In various embodiments, processing system 105 is coupled to performance evaluation and programming unit 111 via line 112. CPU 110 is coupled to memory system 120 via line 101. In various embodiments, the architecture of CPU 110, is based on, for example, ARM, Intel x86, MIPS, etc. In various embodiments, the term "line" and/or "lines" described herein are considered buses or communication links that allow for the communication and/or transfer of data signals and/or other types of signals within, for example, the prescribed systems.

In various embodiments, memory system 120 is a cache memory module that includes, for example, L1 cache memory, L2 cache memory, and L3 cache memory, and other types of memory capable of storing data accessed by CPU 110. In various embodiments, referring momentarily to FIG. 2, memory system 120 includes an error detection and correction unit 261 for correcting and detecting errors implemented by error injection logic unit 273.

In various embodiments, during operation of error detection and correction evaluation system 100, performance evaluation and programming unit 111 programs non-volatile memory located in memory system 120 to utilize pre-existing logic otherwise used to repair faulty bit cells in memory system 120 to have error injection logic (also located in memory system 120) inject an error or plurality of errors into a data word provided by CPU 110 to memory system 120 during a memory access. The data word corresponds to an error injection address programmed into non-volatile memory for use by memory system 120 to store the error injected data word. The error injection logic injects an error/s into the data word and provides the error injected data word to pre-existing logic embedded in, for example, a CAM located in memory system 120.

In some embodiments, in addition to injecting errors, at least a portion of the same logic is used to receive a data word that corresponds to a defective memory address and utilize the defective memory address for row repair. That is, memory addresses with defective memory cells generally are identified and stored in non-volatile memory, typically fuses. During boot of the memory system, the address/s are read from the fuses and stored in a CAM. During a memory access the address is compared to address/s stored in the CAM. If the request address matches the entry in the CAM, an alternate memory address is used, thus not using the defective memory location. However, in various embodiments of the present invention, the pre-existing logic used typically for row repair is also used as part of the error injection process that injects an error into the data word. That is, in various embodiments, in addition to repairing a manufacturing defect, the same logic is used to inject correctable errors at specific memory locations. The use of the error injection logic in combination with the pre-existing logic that is normally used to repair defective bit cells located in memory system 120, allows for performance evaluation of the error detection and correction techniques implemented by memory system 120. Performance evaluation and programming unit 111 uses the error injected data word to evaluate the error and detection techniques and provides output for use by, for example, the user of performance evaluation and programming unit 111. Combining error injection logic with logic that is also used to repair faulty bit cells of memory system 120 improves upon existing techniques by supporting injection test data into the data path using pre-existing logic already assembled by the manufacturer. The use of pre-existing logic allows the performance of error detection and correction techniques to be assessed without a significant increase to the cost of manufacture of processing system 105. That is, the embodiments described herein differ from current solutions in that, with the addition of simple logic, a manufacturer is able to assess and eliminate unnecessary error detection and correction techniques, thereby enhancing processing efficiency and speed.

Figure 2:
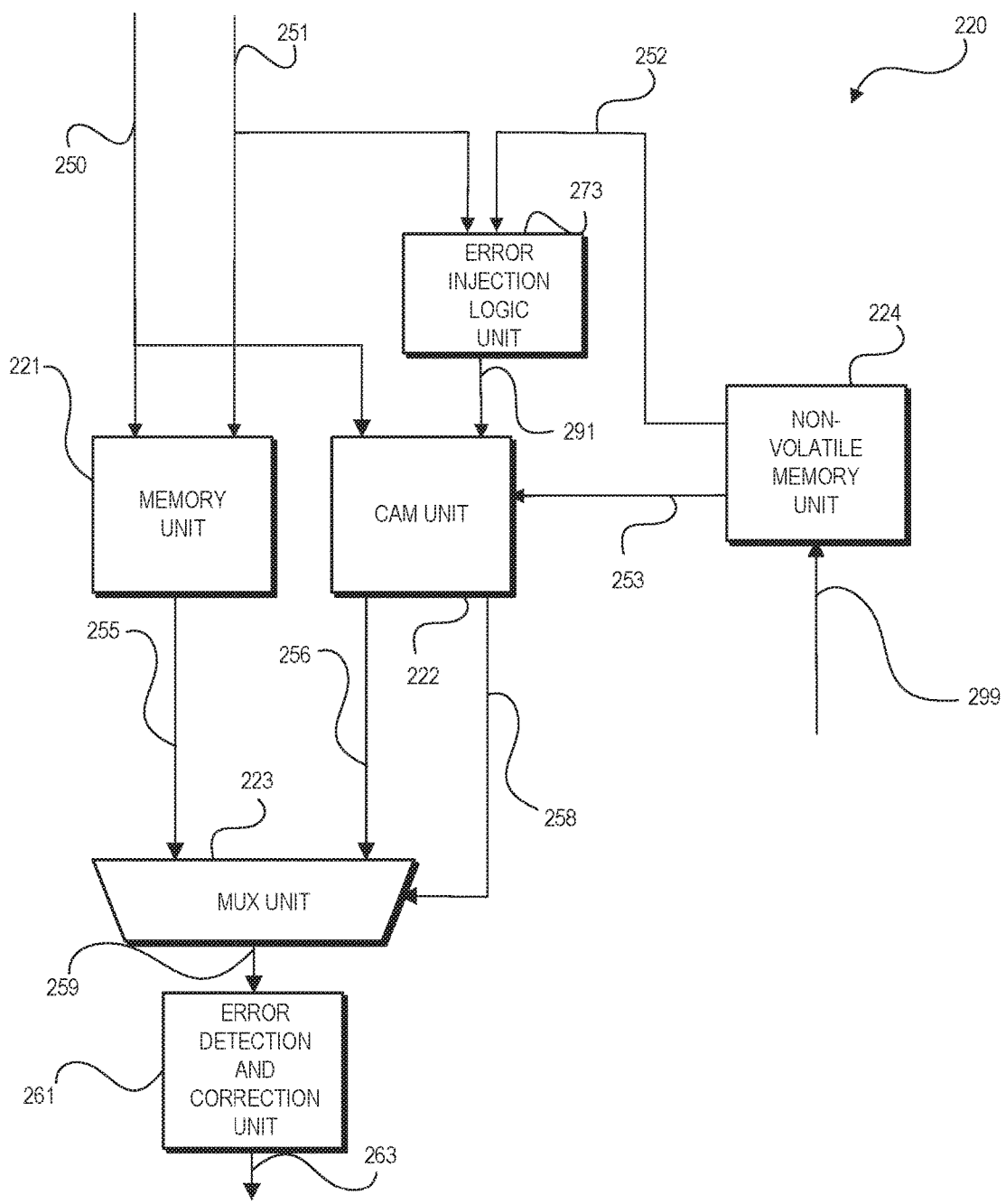
FIG. 2 is a block diagram illustrating a memory system according to various embodiments.

FIG. 2 is a block diagram illustrating a memory system 220 according to various embodiments. Memory system 220 includes a memory unit 221, a content addressable memory (CAM) unit 222, an error injection logic unit 273, a non-volatile memory unit 224, a multiplexer (MUX) unit 223, an error detection and correction unit 261. In various embodiments, memory unit 221 is coupled to an address-data bus (not shown) via line 250 (address bus) and line 251 (data bus). Memory unit 221 is coupled to a MUX unit 223 via line 255. MUX unit 223 is coupled to error detection and correction unit 261 via line 259. MUX unit 223 is coupled to CAM unit 222 via line 256 and line 258. Error detection and correction unit 261 is coupled to the address-data bus via line 263. CAM unit 222 is coupled the address-data bus via line 250. CAM unit 222 is coupled to error injection logic unit 273 via line 291. CAM unit 222 is coupled to non-volatile memory unit 224 via line 253. Error injection logic unit 273 is coupled to the address-data bus via line 251. Error injection logic unit 273 is coupled to non-volatile memory unit 224 via line 252. Non-volatile memory unit 224 is coupled to, for example, performance evaluation and programming unit 111 of FIG. 1 via line 299. In various embodiments, JEDEC standards are used to communicate with non-volatile memory unit 224 via line 299.

In various embodiments, memory unit 221 includes an L1 cache, an L2 cache, and/or an L3 cache. In various embodiments, CAM unit 222 is implemented using, for example, static random-access memory (SRAM), or flip-flops. The non-volatile memories described herein may include, for example, various forms of non-volatile storage. Examples of non-volatile memory include electrical fuses, solid-state memory, such as, for example, NAND flash storage, NOR flash storage, Phase Change Memory (PCM), and Spin-Transfer Torque (STT) Magnetic Random-Access Memory (MRAM). In various embodiments, the number of non-volatile memories, and address-data lines or buses may vary depending upon, for example, system design.

In various embodiments, in order to conduct a performance evaluation of the error detection and correction techniques utilized by error detection and correction unit 261, an error injection fuse and an error injection memory address fuse located in non-volatile memory unit 224 are programmed for error injection. That is, non-volatile memory unit 224 is programmed to allow error injection logic unit 273 to perform an error injection into a data word provided by, for example, CPU 110 via line 251. In various embodiments, the data word is a 32-bit data word, a 64-bit data word, or a variably sized data word depending on system design. In various embodiments, non-volatile memory unit 224 is programmed using performance evaluation and programming unit 111 of FIG. 1. For example, a fuse value for the error injection fuse in non-volatile memory unit 224 is programmed via line 299 to trigger and/or allow error injection logic unit 273 to perform an error injection into the provided data word. In various embodiments, a fuse value for the error injection memory address is programmed into non-volatile memory via line 299 that specifies, for example, the error injection memory address that the error injected data word is to be stored in after error injection. In various embodiments, line 299 may represent a port used to program non-volatile memory unit 224 using, for example, joint test action group (JTAG) standards. Other data ports adhering to other standards may also be utilized. For example, fuse values of non-volatile memory unit 224 may be programmed to select a row address or a plurality of row addresses that correspond to the location or locations of row addresses to store the error injection data word/s after error injection logic unit 273 has performed an error injection.

In various embodiments, during boot-up of memory system 220, error injection memory addresses (e.g., first error injection memory address, second error injection memory address, etc.) that have been programmed into non-volatile memory unit 224 are loaded into CAM unit 222. That is, the identified error injection memory addresses are read from non-volatile memory unit 224 and provided to CAM unit 222 via line 253 for storage. CAM unit 222 receives and stores the identified error injection memory addresses.

In various embodiments, during a memory access of memory system 220, CAM unit 222 receives the memory access address (i.e., the address of the location of the data to be accessed) from CPU 110. CAM unit 222 compares the memory access address to the identified error injection memory addresses stored in CAM unit 222. When the memory access address (the requested address) matches the error injection memory address/s stored in CAM unit 222, a positive match signal is provided to MUX unit 223 via line 258 and an alternate address (e.g., the error injection memory address) in CAM unit 222 is used for storage.

In various embodiments, when non-volatile memory unit 224 has been programmed for error injection and the memory access address corresponds to at least one of the error injection memory address/s stored in CAM unit 222, the data word corresponding to the error injection memory address is provided to error injection logic unit 273. Error injection logic unit 273 receives an error injection logic bit from non-volatile memory unit 224 via line 252 and a data word from CPU 110 via line 251. Error injection logic unit 273 utilizes the error injection logic bit and a first data bit or plurality of data bits (depending on the error detection and correction techniques be evaluated) from the data word and flips the selected bit/s from their current state to an opposite state (e.g., 0 to 1 or 1 to 0), which is indicative of an error in the data word. For example, when non-volatile memory unit 224 has been programmed for a single bit error injection, error injection logic unit 273 intakes the first bit of the data word, and using, a logic gate (described in further detail in FIG. 3), flips the selected bit from its current state to its opposite state.

In various embodiments, error injection logic unit 273 combines the remaining bits with the flipped bit/s and the entire error injected word is provided via line 256 to MUX unit 223. MUX unit 223 then provides the error injected word to error detection and correction unit 261 for normal error detection and correction processes (e.g., SECDED and/or DECTED). Various error evaluation metrics, such as, for example, the number of cycles or time taken to perform the error detection and correction codes, the number of applications that are able to run continuously during error detection and correction, as well as the frequency and reliability of bit error detection and correction, are then stored by performance evaluation and programming unit 111 for use by the manufacturer of processing system 105.

Figure 3:
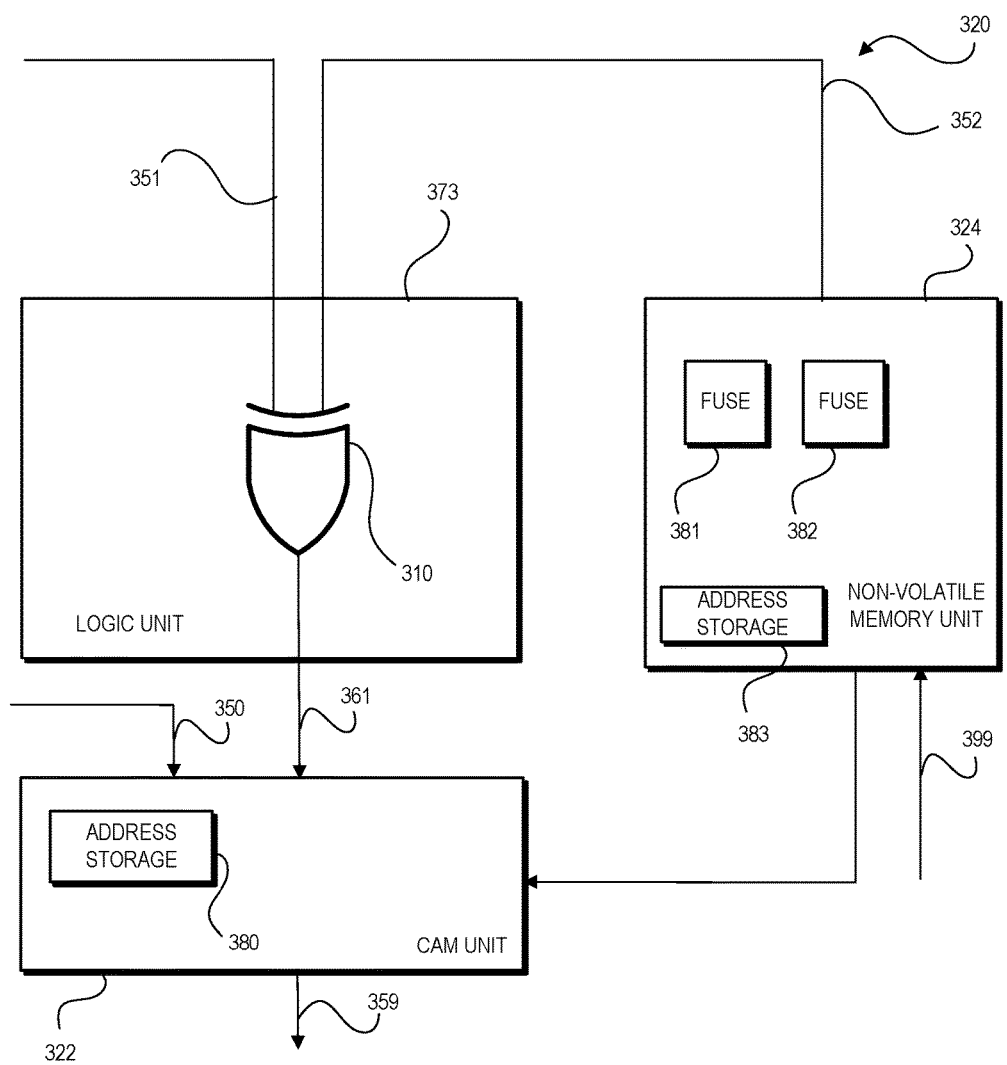
FIG. 3 is a block diagram illustrating a portion of a memory system according to various embodiments.

FIG. 3 is an illustration of a memory system 320 used for error injection and performance evaluation of error detection and correction techniques according to various embodiments. Memory system 320 includes a non-volatile memory unit 324, an error injection logic unit 373, and a CAM unit 322. Non-volatile memory unit 324 includes an error injection fuse 381, an error injection memory address fuse 382, and an error injection memory address storage 383. Error injection logic unit 373 includes an XOR gate 310. CAM unit 322 includes an error injection memory address storage 380. In various embodiments, non-volatile memory unit 324 is coupled to error injection logic unit 373 and CAM unit 322.

In various embodiments, error injection fuse 381 is programmed to allow error injection logic unit 373 to inject an error into a data word provided by CPU 110 via line 351. For example, in various embodiments, error injection fuse 381 is programmed to allow a single error or a plurality of errors (two or more errors) onto a data word. In various embodiments, error injection memory address fuse 382 is programmed via line 399 to allow error injection memory address/s to be stored in error injection memory address storage 383 of non-volatile memory unit 324 for further storage by CAM unit 322.

In various embodiments, during operation of memory system 320, when error injection fuse 381 and error injection memory address fuse 382 have been programmed for a single error injection, an error injection memory address is stored onto an error memory address storage 383 of non-volatile memory unit 324. Upon boot-up, the error injection memory address stored in error injection memory address storage 383 is read by CAM unit 322 and stored onto error injection memory address storage 380 of CAM unit 322. Upon a memory access request via line 350 that corresponds to the error injection memory address stored in CAM unit 322, a first data bit of a data word is provided via line 352 to XOR gate 310 of error injection logic unit 373. Simultaneously, an error injection bit is provided via line 352 to XOR gate 310 via line 352. While the error injection bit is in a high state, XOR gate 310 injects an error into the data word provided to XOR gate 310 of error injection logic unit 373. When the error injection bit is in a low state, the data bits entering error injection bit during its low state are not injected with an error and remain in their present state. The error injected data word is provided to CAM unit 322 via line 361 for storage by error injection memory address storage 380 of CAM unit 322. Thus, because CAM unit 322 is under normal operations when error injection logic unit 373 is provided with a low state, error injection logic unit 373 in combination with pre-existing logic in CAM unit 322 is able to replace a bit cell in, for example, memory unit 221 (referring momentarily to FIG. 2), as is the case during normal memory access operations. The resulting error injected data word is provided to a MUX coupled to CAM unit 322 via line 359 and to an error detection and correction unit (not shown) for error detection and correction. The corrected data word is provided to CPU 110 for processing. Evaluation metrics are then stored by performance evaluation and programming unit 111 for use by the manufacturer of processing system 105. Various embodiments described herein improve upon existing art in that, instead of repairing a manufacturing defect, error injection logic unit 373 injects correctable errors at specific memory location/s.

Figure 4:
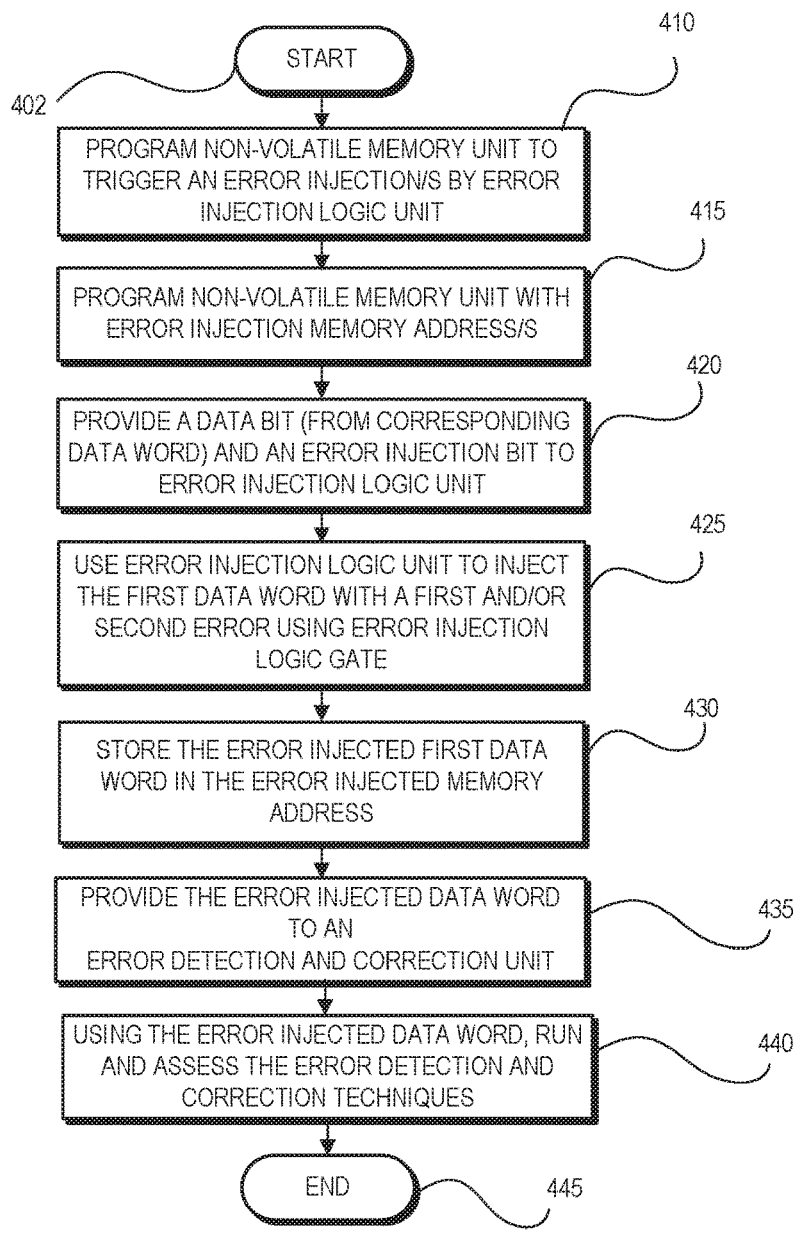
FIG. 4 is a flow diagram illustrating a method of evaluating the performance of error detection and correction techniques according to various embodiments.

FIG. 4 is a simplified flow diagram illustrating a method for evaluating the performance of error detection and correction techniques according to various embodiments. In various embodiments, flow begins with start step 402. In step 410, a non-volatile memory unit is programmed to trigger an error injection/s by an error injection logic unit. In step 415, non-volatile memory unit is programmed with error injection memory addresses that are used by a CAM unit to store a first, second (etc.) data word/s that have been injected with a first and/or second error. In step 420, a data word is provided by a CPU and an error injection bit is provided by a non-volatile memory unit to the error injection logic unit for error injection. In step 425, the error injection logic unit injects the first data word with a first and/or second error using error injection logic. In step 430, the first data word that has been injected with an error/s is stored in the corresponding error injected memory address of the CAM unit. In step 435, the first data word that has been injected with a first error and/or second error is provided to an error detection and correction unit for error detection and correction. In step 440, the error detection and correction unit runs the error detection and correction techniques while the error detection and correction techniques are assessed using the first data word that has been injected with a first and/or second error. At step 445, the method ends.

In various embodiments, a memory system includes a non-volatile memory unit, a content addressable memory unit coupled to the non-volatile memory unit, and an error injection logic unit coupled to the non-volatile memory unit and the content addressable memory unit, wherein the non-volatile memory unit is programmed to allow a first error injection onto a first data word using the error injection logic unit, the error injection logic in combination with the content addressable memory unit being able to replace a bit cell in the memory system.

In various embodiments of the memory system, the error injection logic unit performs the first error injection onto the first data word based on a first data bit of the first data word provided to the error injection logic unit and a first error injection bit provided from the non-volatile memory unit to the error injection logic unit.

In various embodiments of the memory system, the non-volatile memory unit is programmed with a first error injection memory address, the first error injection memory address selected to store the first data word injected with a first error.

In various embodiments of the memory system, the non-volatile memory unit is programmed with an error injection fuse, the error injection fuse being programmed to allow the first error injection onto the first data word.

In various embodiments of the memory system, the non-volatile memory unit is programmed with an error injection memory address fuse that is indicative of a first error injection memory address selected to store the first data word injected with a first error.

In various embodiments of the memory system, a second error injection is performed by the error injection logic unit using a second error injection bit from the non-volatile memory unit.

In various embodiments of the memory system, the first error injection is used to check a performance of at least one error detection and correction code.

In various embodiments of the memory system, the error injection logic unit utilizes a logic gate to flip a first data bit of the first data word from a first state to a second state.

In various embodiments of the memory system, the error injection logic unit performs the first error injection with at least one of an XOR gate, NOR gate, and NAND gate.

In various embodiments, a method includes programming a non-volatile memory unit to trigger a first error injection, providing a first error injection bit to an error injection logic unit, providing a first data bit of a first data word to the error injection logic unit, injecting a first error into the first data word using the first error injection bit and the first data bit of the first data word, and assessing a performance of an error correction code using the first error injected into the first data word and logic embedded in a content addressable memory unit.

In various embodiments, the method further includes programming the non-volatile memory unit with a first error injection memory address, the first error injection memory address selected to store the first data word injected with the first error.

In various embodiments of the method, the programming the non-volatile memory unit to trigger the first error injection is performed using an error injection fuse.

In various embodiments of the method, injecting the first error into the first data word is performed by the error injection logic unit.

In various embodiments of the method, the error injection logic unit includes a first XOR gate that is used to flip the first data bit of the first data word from a first bit state to a second bit state.

In various embodiments, the method further includes providing a second error injection bit to the error injection logic unit, the error injection logic unit using the second error injection bit to inject a second error into the first data word.

In various embodiments, an error detection and correction evaluation system includes a memory unit, a content addressable memory unit coupled to the memory unit, an error injection logic unit coupled to the content addressable memory unit, a non-volatile memory unit coupled to the content addressable memory unit and the error injection logic unit, and a performance evaluation and programming unit coupled to the non-volatile memory unit, wherein the non-volatile memory unit is programmed with the performance evaluation and programming unit to allow the error injection logic unit to inject a first error onto a first data word and the content addressable memory unit to store a first error injection memory address.

In various embodiments of the error detection and correction evaluation system, the error injection logic unit is used to inject the first error onto the first data word using an error injection bit from the non-volatile memory unit and a first data bit from the first data word.

In various embodiments of the error detection and correction evaluation system, the non-volatile memory unit is programmed using an error injection fuse to allow the error injection logic unit to inject the first error onto the first data word.

In various embodiments of the error detection and correction evaluation system, the non-volatile memory unit is programmed with a first error injection memory address, the first error injection memory address selected to store the first data word injected with a first error.

In various embodiments of the error detection and correction evaluation system, the injection of the first error onto the first data word occurs while an application that is not the error injection is running on a central processing unit (CPU).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regards to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A memory system, comprising:
   a non-volatile memory unit;
   a content addressable memory unit coupled to the non-volatile memory unit; and
   an error injection logic unit coupled to the non-volatile memory unit and the content addressable memory unit, wherein:
      the non-volatile memory unit is programmed to allow a first error injection onto a first data word using the error injection logic unit; and
      the error injection logic unit in combination with the content addressable memory unit is configured to replace a bit cell in the memory system.

2. The memory system of claim 1, wherein:
   the error injection logic unit performs the first error injection onto the first data word based on a first data bit of the first data word provided to the error injection logic unit and a first error injection bit provided from the non-volatile memory unit to the error injection logic unit.

3. The memory system of claim 1, wherein:
   the non-volatile memory unit is programmed with a first error injection memory address, the first error injection memory address selected to store the first data word injected with a first error.

4. The memory system of claim 1, wherein:
   the non-volatile memory unit is programmed with an error injection fuse, the error injection fuse being programmed to allow the first error injection onto the first data word.

5. The memory system of claim 1, wherein:
   the non-volatile memory unit is programmed with an error injection memory address fuse that is indicative of a first error injection memory address selected to store the first data word injected with a first error.

6. The memory system of claim 1, wherein:
   a second error injection is performed by the error injection logic unit using a second error injection bit from the non-volatile memory unit.

7. The memory system of claim 1, wherein:
   the first error injection is used to check a performance of at least one error detection and correction code.

8. The memory system of claim 1, wherein:
   the error injection logic unit utilizes a logic gate to flip a first data bit of the first data word from a first state to a second state.

9. The memory system of claim 8, wherein:
   the error injection logic unit performs the first error injection with at least one of a logical exclusive OR gate, a logical NOT-OR (NOR) gate, and a NOT-AND (NAND) gate.

10. A method, comprising:
    programming, by an error injection logic unit, a non-volatile memory unit to trigger a first error injection;
    providing from a processing unit a first error injection bit to the error injection logic unit;
    providing from the processing unit a first data bit of a first data word to the error injection logic unit;
    injecting at the error injection logic unit a first error into the first data word using the first error injection bit and the first data bit of the first data word; and
    assessing at the error injection logic unit, a performance of an error correction code using the first error injected into the first data word and logic embedded in a content addressable memory unit.

11. The method of claim 10, further comprising:
    programming at the error injection logic unit the non-volatile memory unit with a first error injection memory address, the first error injection memory address selected to store the first data word injected with the first error.

12. The method of claim 11, wherein:
    the first error injection memory address is stored at a content addressable memory.

13. The method of claim 10, wherein:
    programming the non-volatile memory unit to trigger the first error injection is performed using an error injection fuse.

14. The method of claim 10, wherein:
    the error injection logic unit includes a logical exclusive OR gate that is used to flip the first data bit of the first data word from a first bit state to a second bit state.

15. The method of claim 10, further comprising
    providing a second error injection bit to the error injection logic unit, the error injection logic unit using the second error injection bit to inject a second error into the first data word.

16. An error detection and correction evaluation system, comprising:
    a memory unit;
    a content addressable memory unit coupled to the memory unit;
    an error injection logic unit coupled to the content addressable memory unit;
    a non-volatile memory unit coupled to the content addressable memory unit and the error injection logic unit; and
    a performance evaluation and programming unit coupled to the non-volatile memory unit, wherein:
       the non-volatile memory unit is programmed with the performance evaluation and programming unit to allow the error injection logic unit to inject a first error onto a first data word; and the content addressable memory unit to store a first error injection memory address.

17. The error detection and correction evaluation system of claim 16, wherein:
    the error injection logic unit is used to inject the first error onto the first data word using an error injection bit from the non-volatile memory unit and a first data bit from the first data word.

18. The error detection and correction evaluation system of claim 16, wherein:
    the non-volatile memory unit is programmed using an error injection fuse to allow the error injection logic unit to inject the first error onto the first data word.

19. The error detection and correction evaluation system of claim 16, wherein:
    the non-volatile memory unit is programmed with the first error injection memory address, the first error injection memory address selected to store the first data word injected with a first error.

20. The error detection and correction evaluation system of claim 16, wherein:
    the injection of the first error onto the first data word occurs while an application that is not the error injection is running on a central processing unit.

* * * * *